United States Patent
Uehara

(10) Patent No.: US 8,203,684 B2
(45) Date of Patent: Jun. 19, 2012

(54) LIQUID CRYSTAL MODULE

(75) Inventor: Takuya Uehara, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 139 days.

(21) Appl. No.: 12/751,487

(22) Filed: Mar. 31, 2010

(65) Prior Publication Data

US 2010/0253900 A1 Oct. 7, 2010

(30) Foreign Application Priority Data

Apr. 1, 2009 (JP) ................ P2009-089172

(51) Int. Cl.
*G02F 1/1345* (2006.01)

(52) U.S. Cl. ...................................... 349/152; 349/149

(58) Field of Classification Search ........... 349/149–152
See application file for complete search history.

(56) References Cited

U.S. PATENT DOCUMENTS

| 5,258,866 | A | 11/1993 | Ishikawa et al. ............... 359/88 |
| 2004/0036833 | A1 | 2/2004 | Monzen | |
| 2007/0246836 | A1* | 10/2007 | Ichiyama .................... 257/778 |

FOREIGN PATENT DOCUMENTS

| JP | 05-021515 | 1/1993 |
| JP | 2000-312070 | 11/2000 |
| JP | 2004-087608 | 3/2004 |

* cited by examiner

*Primary Examiner* — Uyen Chau N Le
*Assistant Examiner* — Chris Chu
(74) *Attorney, Agent, or Firm* — Morgan, Lewis & Bockius LLP

(57) ABSTRACT

A liquid crystal module includes a liquid crystal cell, a board and a base film mounted on the board. Electrodes are aligned on an edge of the liquid crystal cell. Terminals are aligned on an edge of the base film. The terminals include first terminals and a second terminal. The first terminals, is connected to the electrodes by a thermally compression bond, and is disposed so as to be applied a correction before the thermally compression bond. The correction is a offset by which the first terminals correspond to the electrodes after the thermally compression bond. The second terminal is disposed so as to correspond to first one of the electrodes before the thermally compression bond.

1 Claim, 8 Drawing Sheets

LIQUID CRYSTAL MODULE

BACKGROUND

The present invention relates to a liquid crystal module having a combination of a liquid crystal cell and a flexible relay board formed with a COF, and more particularly to a liquid crystal module in which individual and practical lead terminals of lead terminal rows of a flexible relay board such as a chip-on-film are electrically connected to individual lead-out electrodes of lead-out electrode rows of a liquid crystal cell via a thermal compression bonding process.

In the liquid crystal cell used in a display for displaying an image, on an edge part of one glass substrate of the glass substrates which are bonded to each other, many lead-out electrodes are arranged in parallel along the edge. As means for connecting a control circuit mounted on a wiring board to such a liquid crystal cell, the flexible relay board is used. For the flexible relay board, various kinds of boards called TCP, TAB and FPC rich in their flexibility are used as well as the chip-on-film (COF).

The flexible relay board formed with the above-described COF will be described below. In the flexible relay board, lead terminal rows having many practical lead terminals and dummy terminals arranged in parallel are formed on a base film made of a resin film such as polyimide resin. When the flexible relay board is electrically connected to the above-described liquid crystal, the individual and practical lead terminals of the lead terminal rows of the flexible relay board are positioned to and overlapped on the individual lead-out electrodes of the lead-out electrode rows of the liquid crystal cell to carry out a thermal compression bonding process in which the overlapped positions of them are pressurized and heated.

As shown in FIGS. 5 to 7, lead-out electrode rows 20 are formed on an edge part of a glass substrate 11 of one side of a liquid crystal cell 10. In the lead-out electrode rows 20 of an illustrated example, many lead-out electrodes 21 densely arranged in parallel at equal pitches P1 are included.

As compared therewith, in a flexible relay board 50 to be combined with the liquid crystal cell 10, lead terminal rows 60 are formed on an edge part of a rectangular base film 51 on which a liquid crystal control circuit (not shown in the drawing) including an IC chip is formed. In the lead terminal rows 60, many practical lead terminals 61 arranged in parallel and a prescribed number of dummy terminals 65 are included. In the lead terminal rows 60 of an illustrated example, at both sides in row ends of a practical lead terminal row 62 composed of many practical lead terminals 61 respectively, two dummy terminals 65 and 65 are adjacently arranged in parallel.

In FIG. 5, the illustrations of the lead-out electrodes 21 or the practical lead terminals 61 located in an intermediate part in the direction of an arrangement are omitted. Further, a hatching is applied to the dummy terminals 65 and 65.

To the above-described liquid crystal cell 10 and the flexible relay board 50, as marks useful for individually positioning the individual practical lead terminal 61 or the dummy terminals 65 included in the lead terminal rows 60 in the flexible relay board 50 side to the individual lead-out electrodes 21 included in the lead-out electrode rows 20 in the liquid crystal cell 10 side, alignment marks M1 and M2 are respectively attached. The alignment marks M1 and M2 are located at both sides sandwiching the above-described lead-out electrodes row 20 and at both sides sandwiching the lead terminal row 60.

As a method for positioning the individual lead-out electrodes 21 of the liquid crystal cell 10 side and the individual practical lead terminals 61 of the flexible relay board 50 side by using the alignment marks M1 and M2 as the marks, are exemplified a method by an automatic machine and a method of a visual recognition by using a manual machine. The method of the visual recognition by using the manual machine is a method that an operator decides the suitability of an overlapped state of the alignment marks M1 and M2 enlarged and displayed on a monitor by visually recognizing the overlapped state of the marks.

In the above-described thermal compression bonding process, since the overlapped positions of the individual lead-out electrodes 21 of the liquid crystal cell 10 side and the individual practical lead terminals 61 or the dummy terminals 65 of the flexible relay board 50 side are pressurized and heated, the base film 51 of the flexible relay board 50 is thermally expanded to be extended in the direction along the lead terminal rows 60. In accordance with the extension of the base film 51, the pitches between the practical lead terminals 61, the pitches between the dummy terminals 65 and the practical lead terminals 61 and the pitches between the dummy terminals 65 included in the lead terminal rows 60 are increased. The pitches between them are the same. The pitches between them are shown by a sign P2 in FIG. 6.

Thus, in the flexible relay board 50 used in the usual liquid crystal module, a treatment is carried out in which the extension is corrected only in the positions of the practical lead terminals 61 or the dummy terminals 65 of the lead terminal rows 60 by considering the extension percentage of the base film in the thermal compression bonding process, and on the other hand, the extension is not corrected in the positions of the alignment marks M2.

Therefore, in the flexible relay board 50 before the thermal compression bonding process is carried out, as can be understood from FIG. 6, the pitches between the practical lead terminals 61 or the pitches between the dummy terminals 65 and the practical lead terminals 61 (both the pitches are shown by P2) in the flexible relay board 50 side are narrower than pitches P1 between the lead-out electrodes 21 of the liquid crystal cell 10 side. Accordingly, when the alignment marks M1 and M2 of the liquid crystal cell 10 and the flexible relay board 50 respectively are mutually overlapped, the dummy terminal 65 at the row end of the flexible relay board 50 side is located more inside by an amount shown by a sign δ than the lead-out electrode 21 at the row end of the liquid crystal cell 10 side. Then, when the thermal compression bonding process is carried out, as shown in FIG. 7, the base film 51 of the flexible relay board 50 is extended by an amount meeting the extension percentage as shown by an arrow mark A. Thus, the individual practical lead terminals 61 or the individual dummy terminals 65 in the flexible relay board 50 side are separately thermally compression boded to and electrically connected to the individual lead-out electrodes 21 in the liquid crystal cell 10 side.

On the other hand, in the field of the liquid crystal module, a countermeasure is proposed in which an extension correction amount is set after a thermal compression bonding process is applied to a flexible board having a plurality of terminal blocks to connect electrode terminals of the flexible board to electrode terminals of a liquid cell side without a misalignment in all the terminal blocks (for instance, Patent Document 1).

Further, a countermeasure is also proposed in which either pitches of terminals of lead-out electrodes in a liquid cell side or pitches of terminals of output electrode terminal in a flexible board side are set to be constant, and for the other pitches of the terminals, a correction of an extension meeting a coefficient of thermal expansion of the flexible board is set to be small in the central part of the terminal part and to be larger as the terminal part comes nearer to an end side to reduce an imperfect connection (for instance, Patent Document 2).

[Patent Document 1] Japanese Patent Publication Number 2004-87608 A

[Patent Document 2] Japanese Patent Publication Number 2000-312070 A

As described above, in the liquid crystal module according to the usual example described by referring to FIGS. 5 to 7, when the positioning method by the visual recognition is carried out by using the manual machine, the operator decides the suitability of the overlapped state of the alignment marks M1 and M2 enlarged and displayed on the monitor by visually recognizing it.

However, as shown in FIG. 8, the size of the alignment mark M2 is exceptionally larger than the width of the pitches P2 between the practical lead terminals 61 or the dummy terminals 65. For instance, when the pitches P2 between the practical lead terminals 61 or the dummy terminals 65 is 0.05 mm in the flexible relay board 50, the size of the alignment mark M2 is about two times as large as 0.02 mm. Therefore, when the positioning method by the visual recognition is carried out by using the manual machine, even if the operator decides that the overlapped state of the alignment marks M1 and M2 enlarged and displayed on the monitor is suitable by visually recognizing it, the practical lead terminals 61 or the dummy terminals 65 in the flexible relay board 50 side are not necessarily precisely overlapped on the individual lead-out electrodes 21 in the liquid crystal cell 10 side.

SUMMARY

It is therefore one advantageous aspect of the present invention to provide a liquid crystal module that can improve an accuracy of a connection by thermally compression bond a flexible relay board to a liquid crystal cell by applying a countermeasure to the flexible relay board in which even when a positioning method by a visual recognition is carried out by using a manual machine, practical lead terminals of the flexible relay board side are easily and precisely overlapped on individual lead-out electrodes in the liquid crystal cell side.

According to one aspect of the invention, there is provided a liquid crystal module, comprising:
a liquid crystal cell;
a board;
a base film mounted on the board;
electrodes aligned on an edge of the liquid crystal cell; and
terminals aligned on an edge of the base film, the terminals including:
  first terminals, connected to the electrodes by a thermally compression bond, and disposed so as to be applied a correction before the thermally compression bond, the correction being a offset by which the first terminals correspond to the electrodes after the thermally compression bond; and
  a second terminal, disposed so as to correspond to first one of the electrodes before the thermally compression bond.

The liquid crystal module may be configured such that the second terminal is disposed at a first end of a row of the terminals.

The liquid crystal module may be configured such that: the terminals includes a third terminal; the third terminal is disposed so as to correspond to second one of the electrodes before the thermally compression bond; and the third terminal is disposed at a second end of the row opposite to the first end.

The liquid crystal module may be configured such that: the terminals includes a fourth terminal; the fourth terminal is disposed so as to correspond to third one of the electrodes before the thermally compression bond; and the fourth terminal is adjacent to the second terminal.

The liquid crystal module may be configured such that the correction is applied to a dimension between a first one of the first terminals disposed at first end of a row of the first terminals and a second one of the first terminals disposed at second end of the row of the first terminals opposite to the first end of the row of the first terminals.

DETAILED DESCRIPTION OF EXEMPLIFIED EMBODIMENTS

Figure 1:
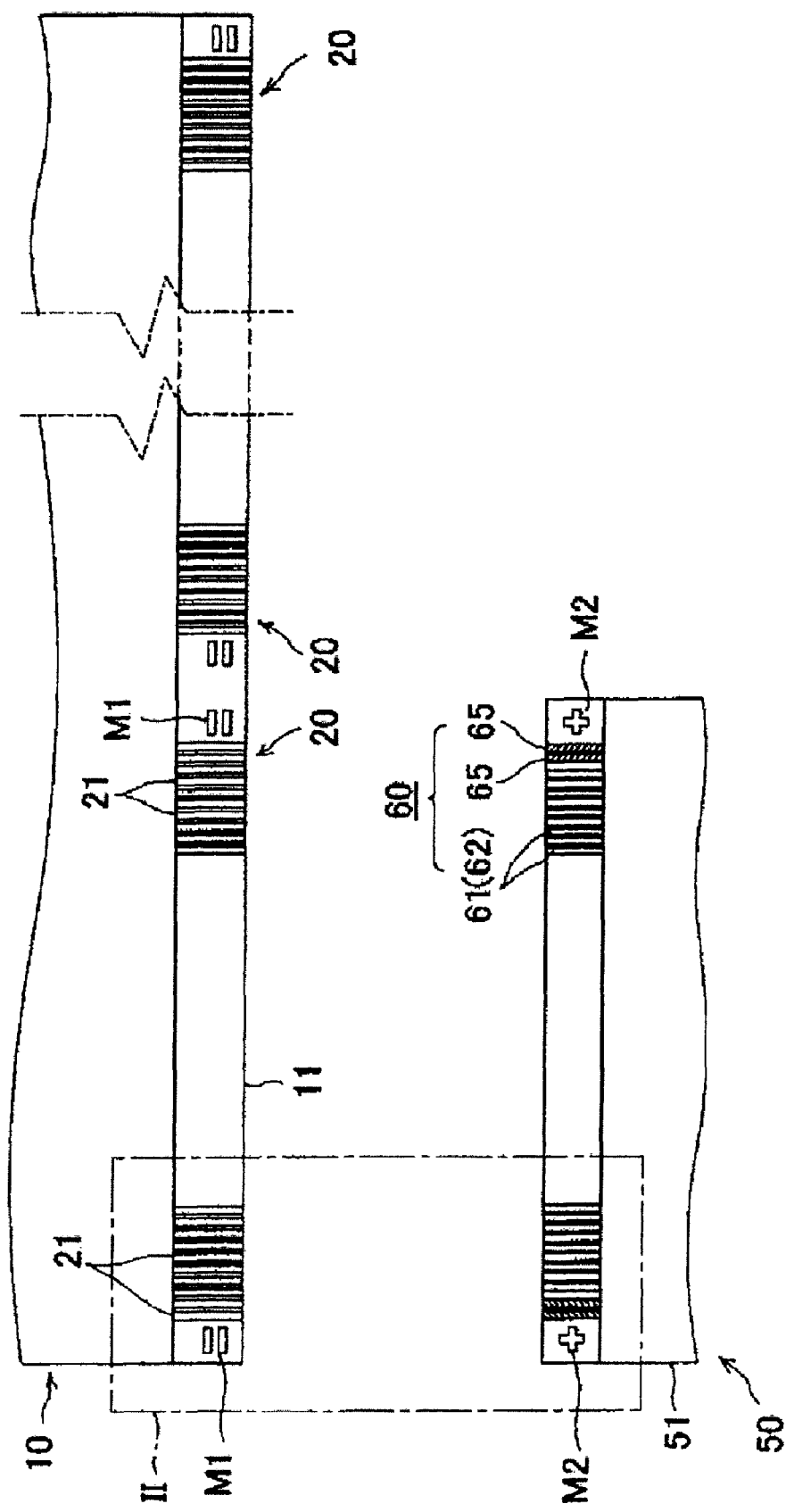
FIG. 1 is a partly broken plan view showing and explaining a liquid crystal cell and a flexible relay board used in a liquid crystal module according to an embodiment of the present invention.
Figure 2:
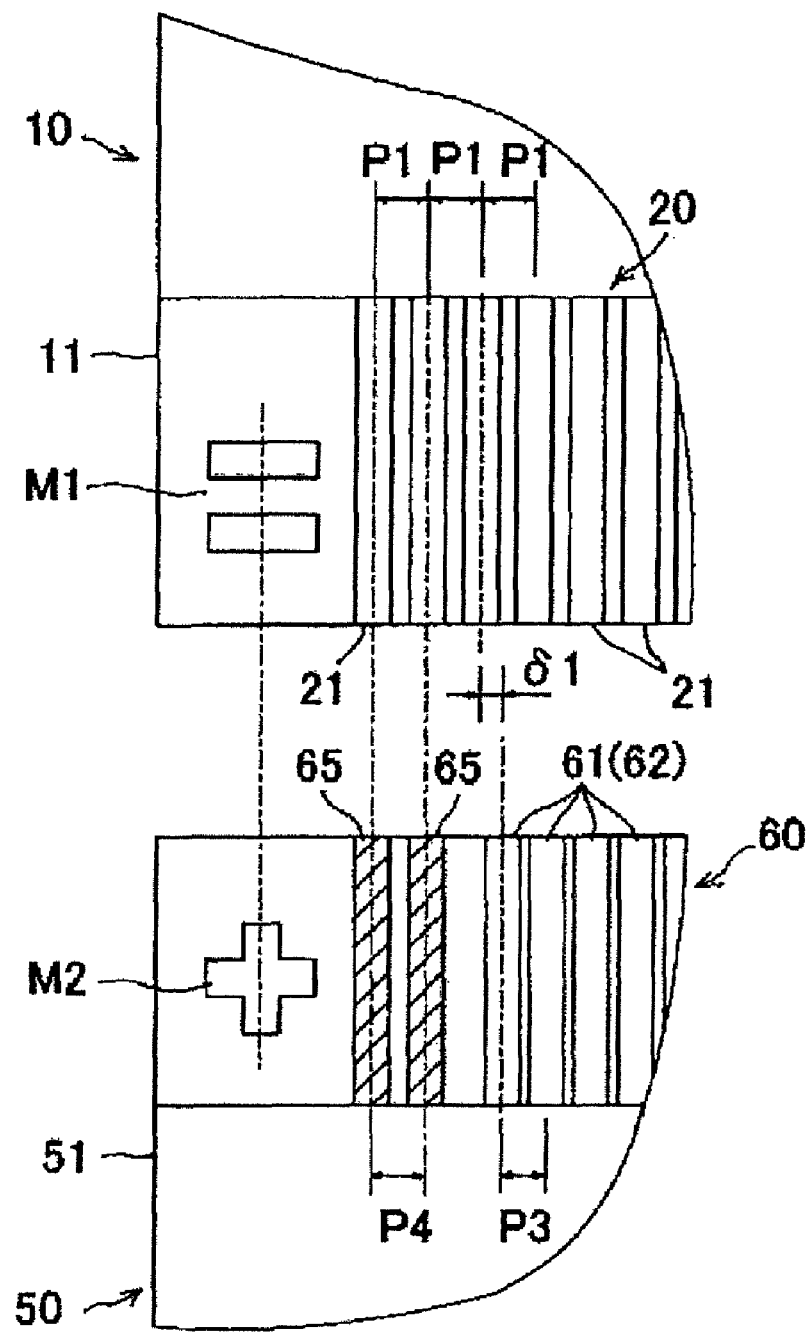
FIG. 2 is a plan view showing a II part of FIG. 1.
Figure 3:
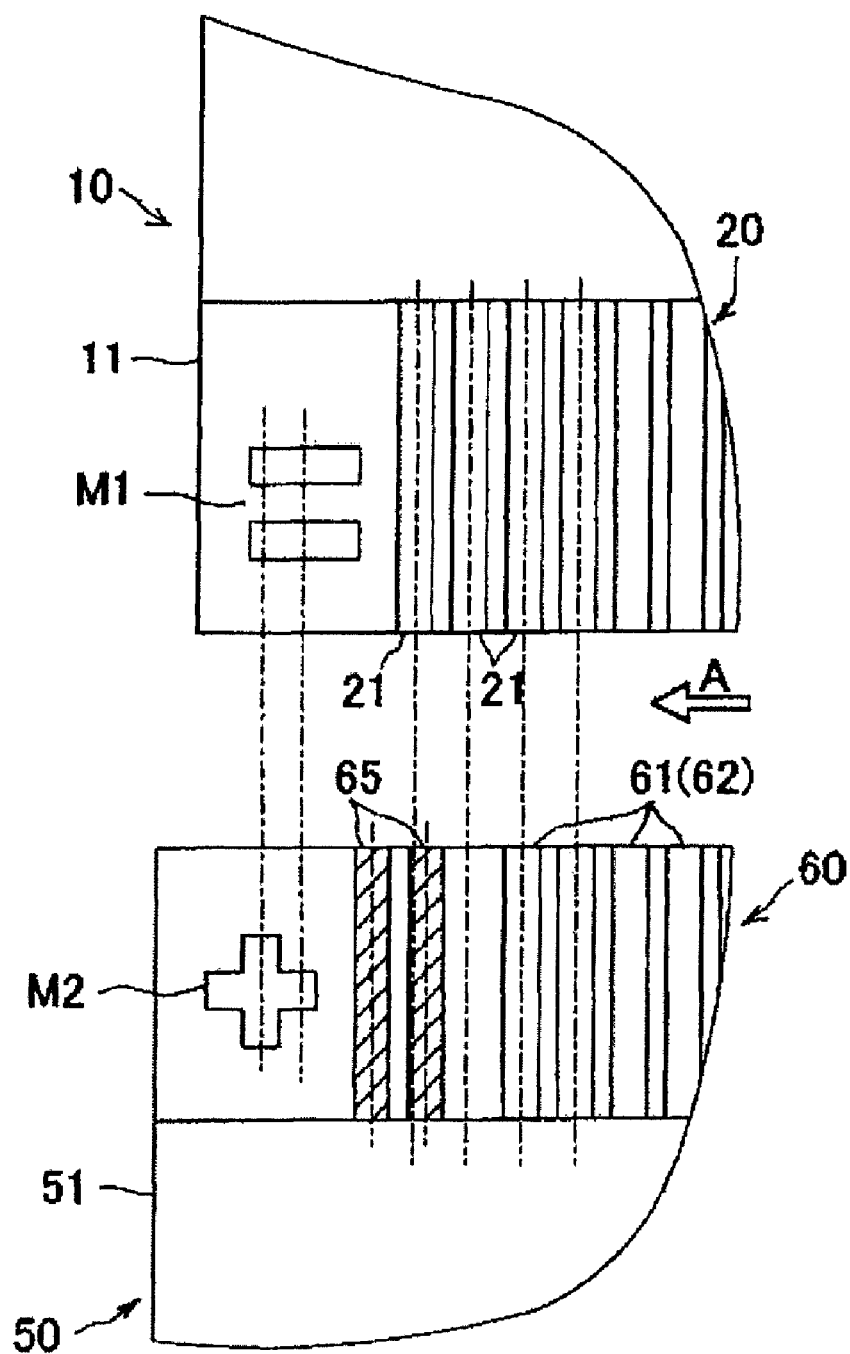
FIG. 3 is a plan view explaining and showing a state after the flexible relay board is attached to the liquid crystal cell in the liquid crystal module shown in FIG. 1.
Figure 5:
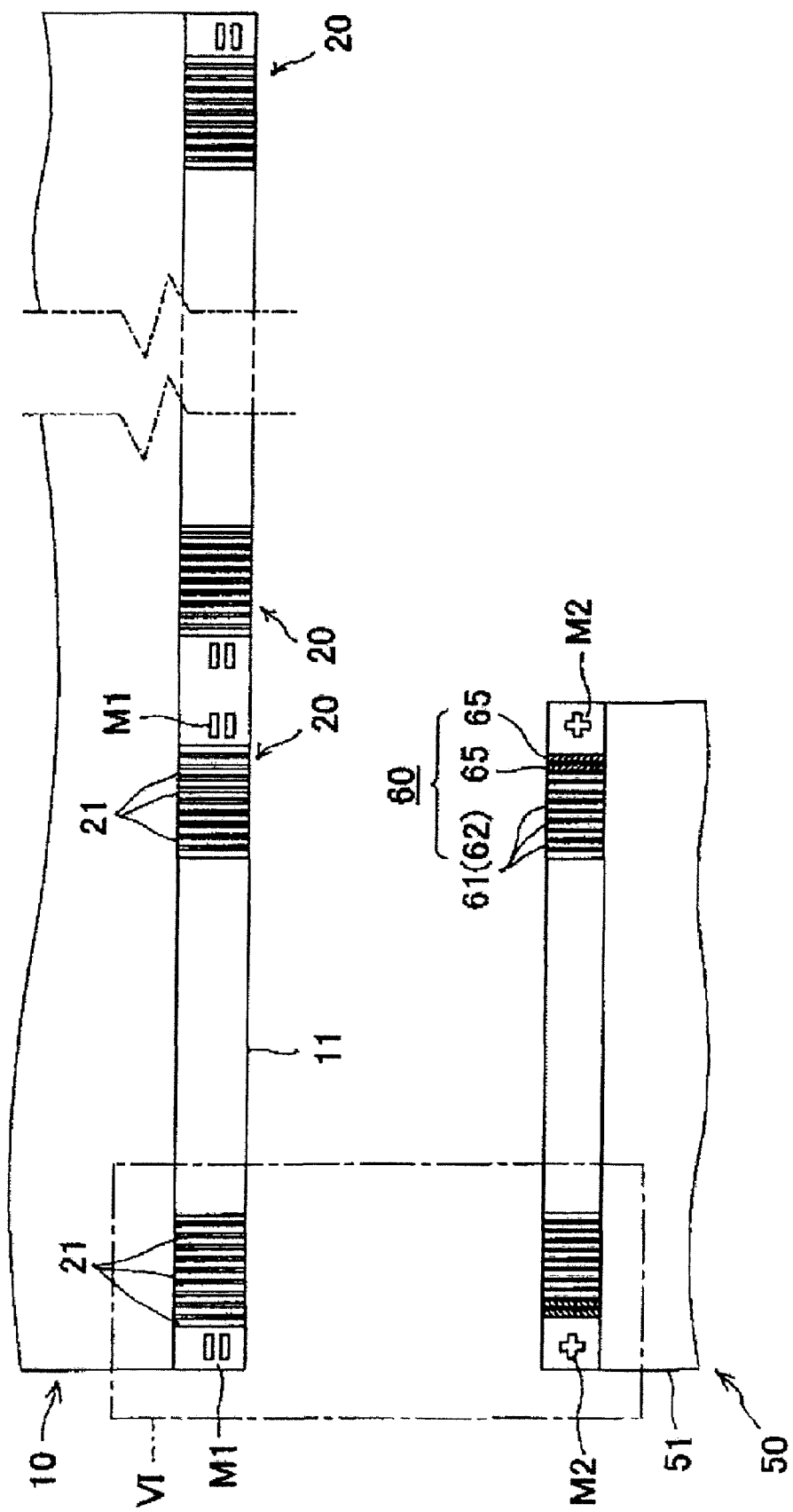
FIG. 5 is a partly broken plan view showing and explaining a liquid crystal cell and a flexible relay board according to a related-art.
Figure 6:
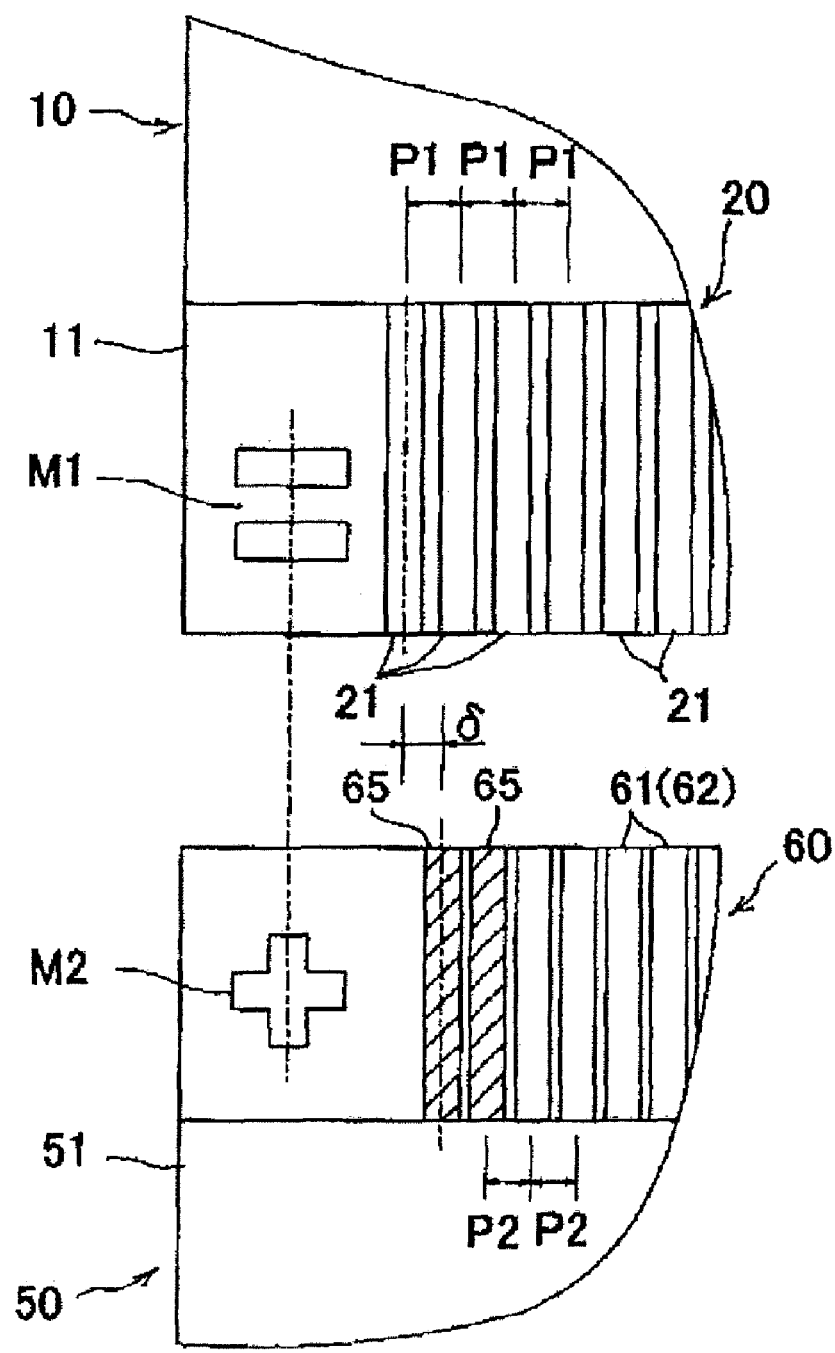
FIG. 6 is a plan view showing a VI part of FIG. 5.
Figure 7:
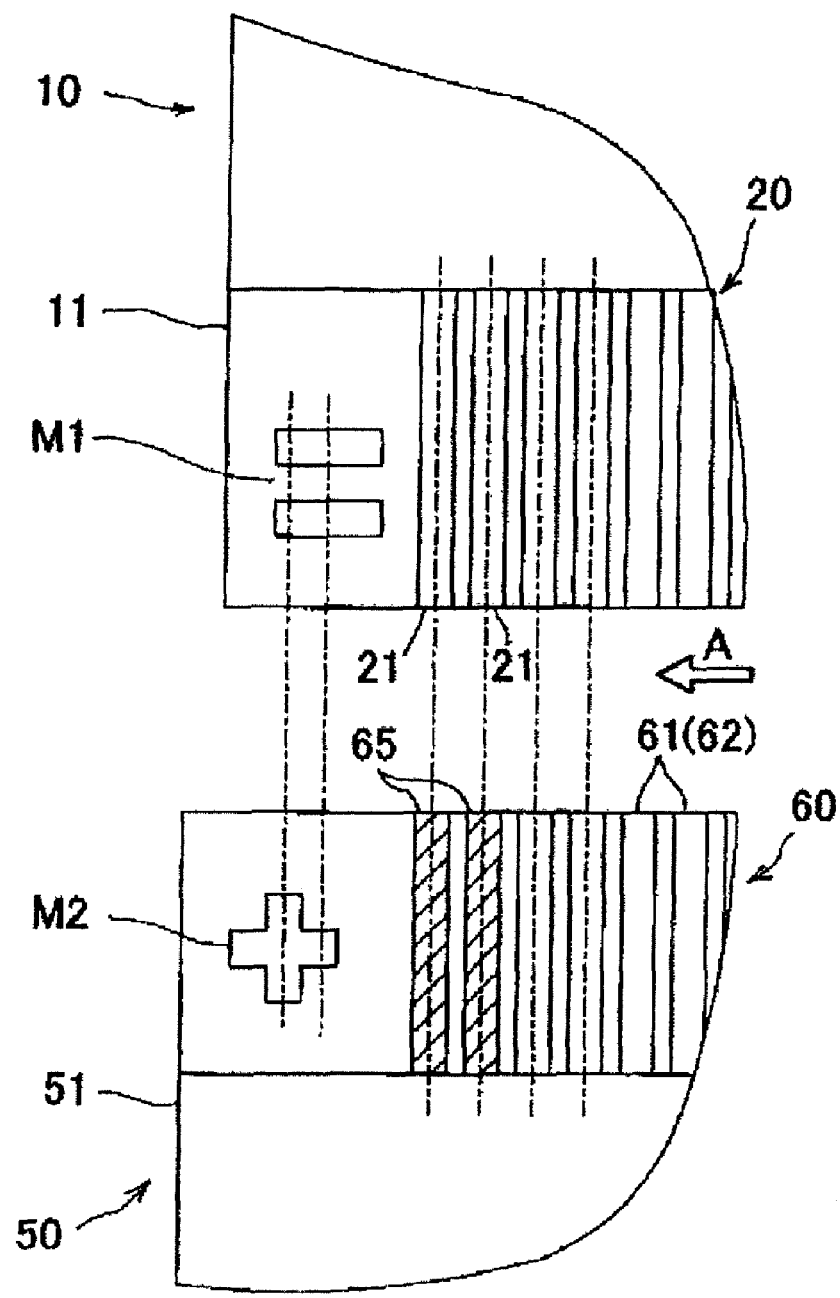
FIG. 7 is a plan view explaining and showing a state after the flexible relay board is attached to the liquid crystal cell in the liquid crystal module shown in FIG. 5.
Figure 8:
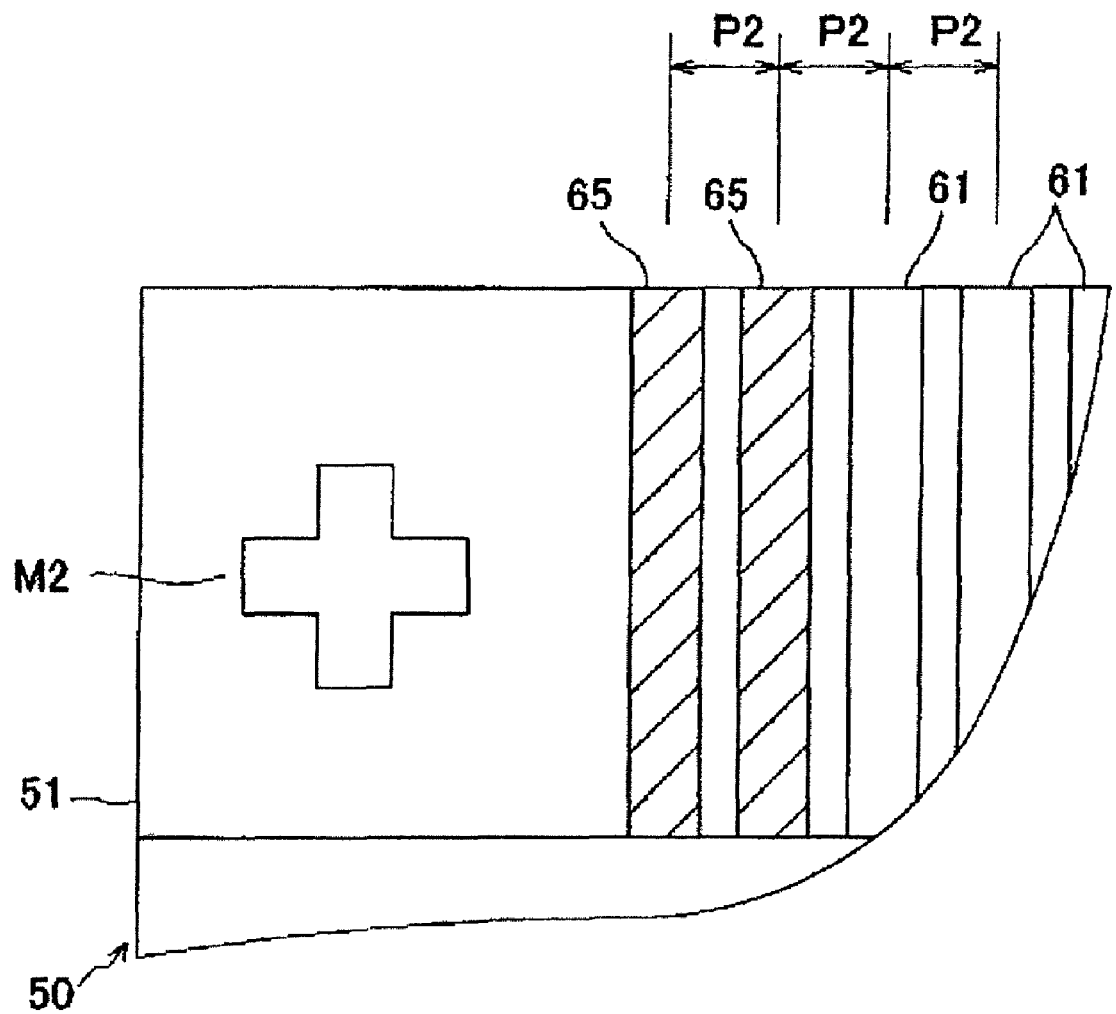
FIG. 8 is an enlarged plan view for explaining and comparing the size of an alignment mark with the width of pitches between practical lead terminals in the liquid crystal module shown in FIG. 5.

As shown in FIGS. 1 to 3, a structure of a liquid crystal cell 10 is the same as that of the liquid crystal cell described by referring to FIG. 5. Namely, lead-out electrode rows 20 are formed on an edge part of a glass substrate 11 of one side of the liquid crystal cell 10. In the lead-out electrode rows 20, many lead-out electrodes 21 densely arranged in parallel at equal pitches P1 are included.

As compared therewith, similarly to the flexible relay board described by referring to FIG. 5, in a flexible relay board 50 to be combined with the liquid crystal cell 10, lead terminal rows 60 are formed on an edge part of a rectangular base film 51 on which a liquid crystal control circuit (not shown in the drawing) including an IC chip is formed. In the lead terminal rows 60, many practical lead terminals 61 arranged in parallel and a prescribed number of dummy terminals 65 are included. In the lead terminal rows 60 of an illustrated example, at both sides in row ends of a practical lead terminal row 62 composed of many practical lead terminals 61 respectively, two dummy terminals 65 and 65 are adjacently arranged in parallel. The dummy terminals 65 and 65 have the same sizes as those of the practical lead terminals 61.

Here, the practical lead terminals 61 are used for actually forming a signal path. The dummy terminals 65 are not actually used for forming the signal path.

In FIG. 1, the illustrations of the lead-out electrodes 21 or the practical lead terminals 61 located in an intermediate part in the direction of an arrangement are omitted. Further, a hatching is applied to the dummy terminals 65 and 65.

To the above-described liquid crystal cell 10 and the flexible relay board 50, as marks useful for individually positioning the individual practical lead terminal 61 included in the lead terminal rows 60 in the flexible relay board 50 side to the individual lead-out electrodes 21 included in the lead-out electrode rows 20 in the liquid crystal cell 10 side, alignment marks M1 and M2 are respectively attached. The alignment marks M1 and M2 are located at both sides sandwiching the above-described lead-out electrodes row 20 and at both sides sandwiching the lead terminal row 60.

In this embodiment, a correction of an extension considering the extension percentage of the base film 51 in a thermal compression bonding process is applied only in the positions of the practical lead terminals 61 of the lead terminal rows 60 in the flexible relay board 50 side. Accordingly, the correction of the extension is not applied to the positions of the two dummy terminals 65 and 65 respectively located at both the sides in the row ends of the practical lead terminal row 62.

In the liquid crystal module constructed as described above, in the flexible relay board 50 before the thermal compression bonding process is carried out, as can be understood from FIG. 2, pitches P3 between the practical lead terminals 61 in the flexible relay board 50 side are narrower than the pitches P1 between the lead-out electrodes 21 of the liquid crystal cell 10 side. As compared therewith, pitches P4 between the two dummy terminals 65 and 65 at the row ends in the flexible relay board side 50 have the same values as those of the pitches P1 between the lead-out electrodes 21 in the liquid crystal cell 10 side.

In a positioning process as a pre-process of the thermal compression bonding process, the two dummy terminals 65 and 65 at the row ends of the flexible relay board 50 side are individually overlapped on the two lead-out electrodes 21 and 21 located in row ends of the lead-out electrode rows 20 in the liquid crystal cell 10 side. In the positioning process, an operator visually decides the suitability of the overlapped state of the two dummy terminals 65 and 65 and the two lead-out electrodes 21 and 21 which are enlarged and displayed on a monitor.

As shown in FIG. 2, when the positioning process is carried out to overlap the two dummy terminals 65 and 65 on the two lead-out electrodes 21 and 21, the practical lead terminal 61 at the row end of the practical lead terminal row 62 in the flexible relay board 50 side is located more inside of the flexible relay board 50 by an amount shown by a sign δ1 than a third lead-out electrode 21 from the row end in the liquid crystal cell 10 side.

When the above-described positioning process is carried out, since the size of the dummy terminal 65 is determined to be the same as the size of the practical lead terminal 61, it is recognized that the positioning process can be easily carried out with a higher accuracy than that when the overlapped state of the alignment marks M1 and M2 is visually decided as described in the usual example.

When the thermal compression bonding process is carried out after the above-described positioning process is carried out, as shown in FIG. 3, the base film 51 of the flexible relay board 50 is extended by an amount meeting the extension percentage thereof as shown by an arrow mark A. Thus, the individual practical lead terminals 61 in the flexible relay board 50 side are separately thermally compression boded to and electrically connected to the individual lead-out electrodes 21 in the liquid crystal cell 10 side. Even when the dummy terminals 65 are misaligned with the two lead-out electrodes 21 at the row ends in the liquid crystal cell 10 side via the thermal compression bonding process, since the dummy terminals 65 are terminals which are not originally used, the performance of the liquid crystal module is not adversely affected. Even when an alignment mark M2 is misaligned with an alignment mark M1 in the liquid crystal cell 10 side, since the alignment marks M1 and M2 are not electric elements, the performance of the liquid crystal module is not adversely affected as mentioned above.

In this embodiment, the dummy terminals 65 of the flexible relay board 50 side are located respectively at both sides in the row ends of the lead terminal rows 60. According to this structure, the operator easily specifies the dummy terminals 65 in the lead terminal rows 60 of the flexible relay board 50. Further, the correction of the extension applied to the positions of the practical lead terminals 61 is easily designed or set.

In this respect, the dummy terminals 65 may be located only in one row end of the lead terminal row 60.

In this embodiment, the two dummy terminals 65 are provided adjacent each other in the row end. According to this structure, since the operator can position the two dummy terminals 65 to the two lead-out electrodes 21 in the liquid crystal cell side, the accuracy in positioning is the more easily improved.

In this respect, the number of the dummy terminals 65 in the row end may be one or a number more than three.

Figure 4:
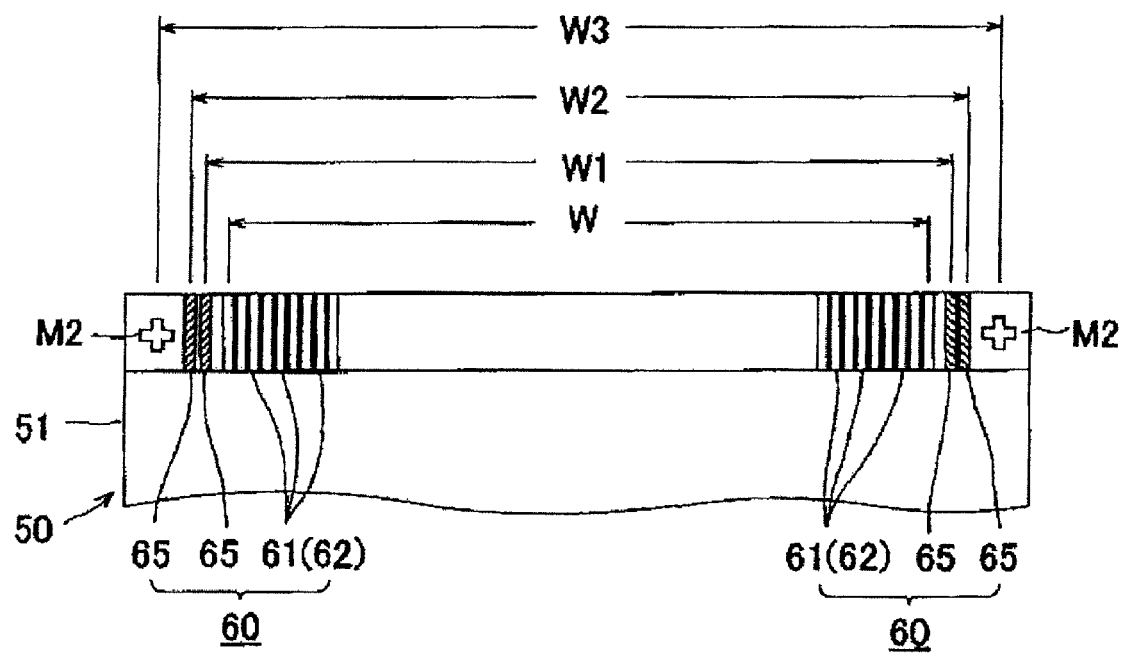
FIG. 4 is an explanatory view of applying a correction of an extension to practical lead terminals.

As shown in FIG. 4, for applying the correction of the extension to the positions of the practical lead terminals 61, a method is employed in which a space dimension W between the two practical lead terminals 61 and 61 located at both the sides in the row ends of the practical lead terminal row 62 is shortened by considering the extension percentage of the base film 51 in the thermal compression bonding process. According to this method, the correction of the extension applied to the positions of the practical lead terminals 61 is advantageously easily designed and set. In the drawing, W1 designates a space dimension between second dummy terminals 65 and 65 at both the sides in the row ends of the lead terminal row 60, W2 designates a space dimension between the dummy terminals 65 and 65 at both the sides in the row ends of the lead terminal row 60 and W3 designates a space dimension between the alignment marks M2 and M2 at both the sides of the lead terminal row 60. The correction of the extension as described above is not applied to W1, W2 and W3.

In the liquid crystal module of this embodiment, in the flexible relay board 50, not only the dummy terminals 65 which can be used for the positioning process are provided in place of the alignment mark M2, but also the alignment mark M2 is provided. Accordingly, when the positioning process is carried out, both the dummy terminals 65 and the alignment mark M2 may be used. Further, the alignment mark M2 may be omitted.

Although only some exemplary embodiments of the invention have been described in detail above, those skilled in the art will readily appreciated that many modifications are possible in the exemplary embodiments without materially departing from the novel teachings and advantages of the invention. Accordingly, all such modifications are intended to be included within the scope of the invention.

The disclosure of Japanese Patent Application No. 2009-089172 filed Apr. 1, 2009 including specification, drawings and claims is incorporated herein by reference in it is entirety.

What is claimed is:

1. A liquid crystal module, comprising:
a liquid crystal cell;
a board;
a base film mounted on the board;
electrodes aligned on an edge of the liquid crystal cell with a first pitch;
a pair of alignment marks, one of the alignment marks being provided on the board, the other of the alignment marks being provided on the liquid crystal cell;
first terminals aligned on an edge of the base film with a second pitch, and connected to the electrodes by a thermal compression bond; and
second terminals aligned on the edge of the base film, wherein
the base film is thermally expanded in an alignment direction of the first terminals through the thermal compression bond;
the first terminals are aligned on the edge of the base film with a third pitch shorter than the second pitch before the thermal compression bond;
a first pair of the second terminals disposed at one end of a row of the first terminals are aligned with each other with the first pitch before the thermal compression bond, so that positions of the first pair of the second terminals correspond to positions of a first pair of the electrodes before the thermal compression bond;
a second pair of the second terminals disposed at an other end of the row of the first terminals are aligned with each other with the first pitch before the thermal compression bond, so that positions of the second pair of the second terminals correspond to positions of a second pair of the electrodes before the thermal compression bond; and
a position of the other of the alignment marks corresponds to a position of the one of the alignment marks before the thermal compression bond.

* * * * *